United States Patent [19]

Miyazawa

[11] Patent Number: 4,921,815
[45] Date of Patent: May 1, 1990

[54] METHOD OF PRODUCING A SEMICONDUCTOR MEMORY DEVICE HAVING TRENCH CAPACITORS

[75] Inventor: Hiroyuki Miyazawa, Kodaira, Japan
[73] Assignee: Hitachi, Ltd., Tokyo, Japan
[21] Appl. No.: 203,931
[22] Filed: Jun. 8, 1988

Related U.S. Application Data

[62] Division of Ser. No. 751,557, Jul. 3, 1985, abandoned.

[30] Foreign Application Priority Data

Jul. 4, 1984 [JP] Japan ................... 59-137189

[51] Int. Cl.⁵ ............... H01L 27/10; H01L 29/78
[52] U.S. Cl. ........................... 437/52; 437/38; 437/47; 437/60; 437/203; 437/919; 437/61; 357/23.6
[58] Field of Search ............ 437/203, 47, 51, 52, 437/60, 78, 203, 919, 38; 357/23.6

[56] References Cited

U.S. PATENT DOCUMENTS 4,353,086  10/1982  Jaccodine .................. 357/51

FOREIGN PATENT DOCUMENTS 0088451  9/1983  European Pat. Off. ......... 357/23.6
51-130178 11/1976 Japan.
0043171  4/1981  Japan.
0212161 12/1983 Japan ....................... 437/47
0092547  5/1984  Japan ....................... 437/67
0012752  1/1985  Japan.

OTHER PUBLICATIONS

Furuyama et al; "A Vertical Capacitor Cell For ULSI Drams", 1984 Symposium on VLSI Techn, Dig. of Tech. Papers #10-12 Sep. 1984–San Diego, Ca.
Boonstra et al., IEEE J. of Solid State Circuits, vol. SC-8, No. 5, 1973, pp. 305–310.

Primary Examiner—Brian E. Hearn
Assistant Examiner—T. Thomas
Attorney, Agent, or Firm—Antonelli, Terry & Wands

[57] ABSTRACT

A D-RAM is disclosed which isolates the capacitors of memory cells and also isolates the adjacent memory cells by utilizing trenches formed on a semiconductor substrate. The device is particularly intended to the area of each memory cell and prevent the occurrence of a leakage current between the adjacent memory cells. Two side walls of the trench are used as the capacitors of two different memory cells, respectively, and these capacitors are isolated from each other by a thick oxide film that is formed on the bottom of each trench.

17 Claims, 4 Drawing Sheets

METHOD OF PRODUCING A SEMICONDUCTOR MEMORY DEVICE HAVING TRENCH CAPACITORS

This is a divisional of application Ser. No. 751,557, filed July 3, 1985, now abandoned.

BACKGROUND OF THE INVENTION

This invention relates generally to a semiconductor memory device which improves the integration density, and more particularly to a semiconductor memory device having a trench type capacitor such as a D-RAM (a dynamic random access memory).

A D-RAM needs a smaller number of elements constituting memory cells than an S-RAM (static random access memory), but further miniaturization of the elements must be made in order to satisfy the requirement for a higher integration density. Attempts have therefore been made to miniaturize the memory element and to improve the integration density by reducing the area of a capacitor that occupies a relatively large area among constituents of the memory element.

For instance, a semiconductor device shown in FIG. 1 of the accompanying drawings has a so-called "trench type capacitor structure". A trench 2 is defined on the surface of a semiconductor substrate 1, and an insulating film 3 such as $SiO_2$ is disposed along the side walls or bottom surface of this trench 2. A polysilicon film 4 as a first electrode is then formed, thereby forming a capacitor $C_1$ in the direction of thickness (depth) of the substrate 1. In the drawing, symbol $Q_1$ represents an MOS (medal oxide semiconductor) field effect transistor (MOSFET) that constitutes a memory element and is connected to the capacitor $C_1$. The transistor $Q_1$ is equipped with a diffusion layer 5 as a source-drain region, a gate insulating film 6 such as an $SiO_2$ film and a gate electrode (second gate electrode) 7 consisting of polysilicon.

In this D-RAM structure, the capacitor $C_1$ secures a predetermined capacity by the electrode surface extending in the direction of thickness of the substrate 1. For this reason, the occupying area of unit memory element can be reduced in comparison with a conventional type which requires the same area in the direction of the plane of the substrate, so that the integration density can be drastically improved.

As can be seen from FIG. 1, however, this structure makes use of an element isolation film (a field insulating film) 8 disposed on the surface of the substrate 1 in order to isolate adjacent capacitors $C_1$ and $C_1$ from each other. Therefore, a leakage current is likely to develop between the capacitors $C_1$ and $C_1$ below the element isolation film 8, that is, between the memory elements, and this leakage current results in the drop of reliability of the memory device. To eliminate this problem, the gap (isolation dimension) $l_v$ between the capacitors $C_1$ and $C_1$ must be sufficient to prevent the leak. This in turn results in a corresponding increase of pitch $l_p$ of unit memory element, and hinders the miniaturization and high integration density of the device.

Incidentally, D-RAM using the trench type capacitors is disclosed, for example, in Japanese Kokai 58-130178.

SUMMARY OF THE INVENTION

It is a primary object of the present invention to provide a semiconductor device which makes it possible to reduce the isolation width between the memory elements, and hence to further miniaturize a unit memory element and to improve the integration density of a memory device.

The above and other objects and novel features of the present invention will become more apparent from the following detailed description to be taken in conjunction with the accompanying drawings.

Among the inventions disclosed herein, the following a typical example.

A trench is formed on the main surface of a semiconductor substrate and an element isolation region is formed at the bottom of the trench. A capacitor is formed in such a manner as to extend along the side walls of the trench to the main surface of the substrate. This arrangement can reliably prevent the leak between adjacent capacitors, can drastically reduce the element separation width, can improve the reliability of the device and can accomplish the higher integration density.

DESCRIPTION OF THE PREFERRED EMBODIMENTS

Figure 1:
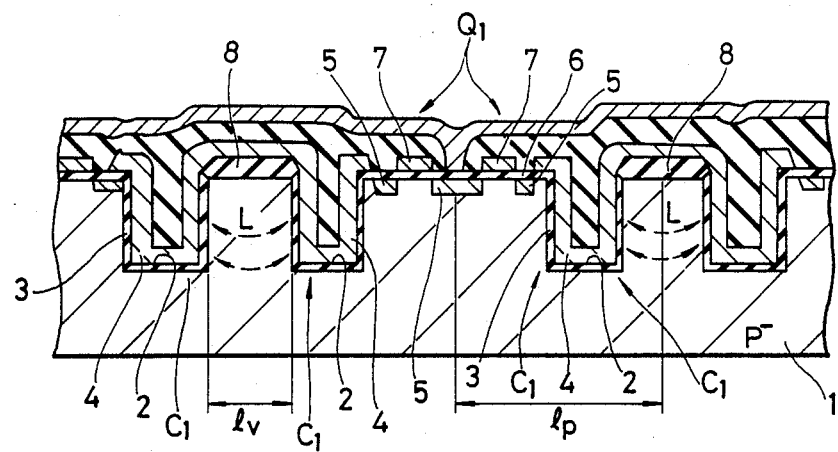
FIG. 1 is a sectional view useful for explaining the disadvantage of a prior art device.
Figure 2:
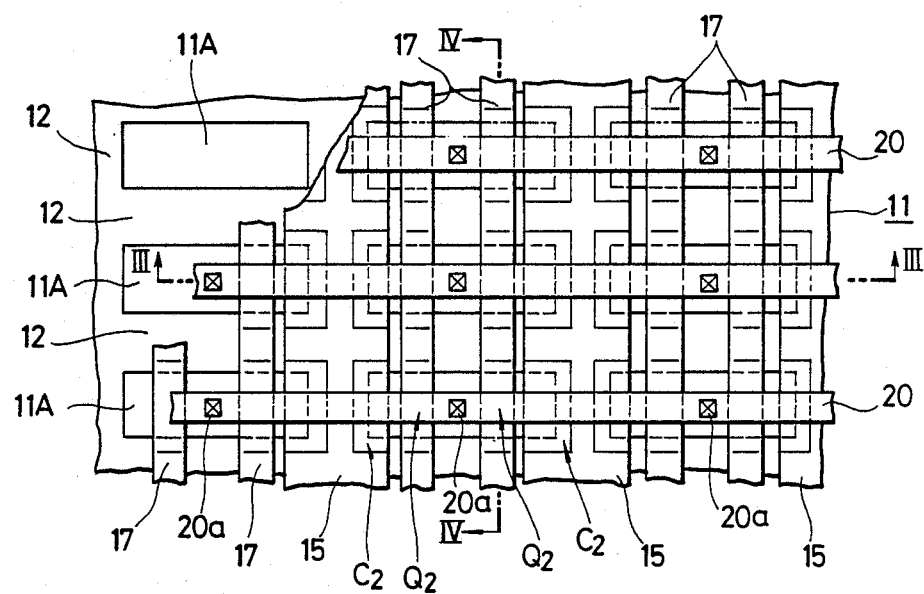
FIG. 2 is a plan view of one embodiment of the present invention.
Figure 3:
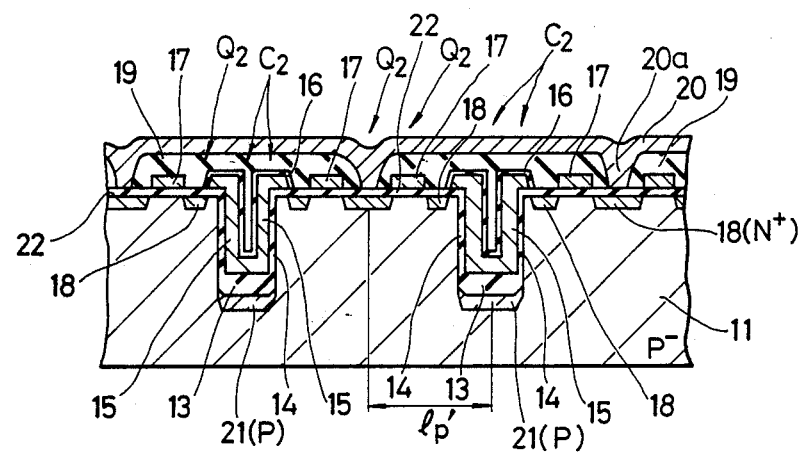
FIG. 3 is a sectional view taken along line III—III of FIG. 2.
Figure 4:
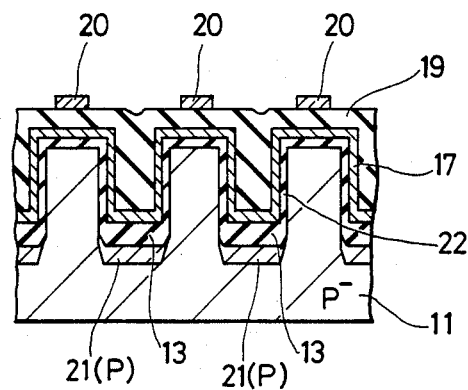
FIG. 4 is a sectional view taken along line IV—IV of FIG. 2.

FIGS. 2 through 4 are plan and longitudinal sectional views of an open bit line type D-RAM in accordance with one embodiment of the present invention. In FIG. 2, an inter-layer insulating film is omitted for ease of illustration.

In these drawings, a memory element has a one-element type memory cell structure with each memory cell comprised of MOSFET $Q_2$ and capacitor $C_2$. MOSFET $Q_2$ is formed on the main surface of a semiconductor substrate 11, while the capacitor $C_2$ is formed in such a manner as to extend to side walls of a trench 12 which is in turn formed on the substrate 11 or to a part of the main surface.

In other words, rectangular checked trenches 12 are formed in a predetermined depth and in a predetermined small width on the main surface of the semiconductor substrate 11 made of $p^-$ type single crystal silicon. The checked trenches 12 define therebetween a plurality of rectangular islands 11A each of which have main surfaces are divided from one another. In FIG. 2, part of each layer on the left is omitted in order to clarify the shapes of the trench 12 and rectangular island 11A.

An element isolation region 13 is defined by a thick $SiO_2$ film at the bottom of each trench 12. A P type channel stopper 21 as the element isolation region is formed below this $SiO_2$ film 13. Since the $SiO_2$ film 13 and the P type channel stopper 21 are formed at the bottom of each trench 12, they define a checkered structure.

A first gate insulating film 14 as the dielectric of the capacitor, which is made of a thin SiO2 film, is formed on the side walls of the trench 12 or at each end of the island-like main surface. A first gate electrode 15 as the electrode of the capacitor, which is made of a polycrystalline silicon film, is formed on the first gate insulating film 14 and the element isolation region 13 described above. As shown in FIG. 2, a plurality of first gate electrodes 15 extend unidirectionally inside a memory cell array. On the side walls of the trench 12 or portions of the main surface (both ends of the island), the capacitor C2 extending in a direction vertical to the main surface of the substrate 11 comprises the substrate 11, the first gate insulating film 14 and the first gate electrode 15.

An SiO2 film 16 is formed on the first gate electrode 15, and a second gate insulating film 22, on the main surface. A second gate electrode (a word line) 17 made of a polycrystalline silicon film is formed on the second gate insulating film 22 in the same direction as the first gate electrode 15. The film of refractory metals such as molybdenum, tungsten, tantalum, titanium and the like, the film of the silicides of these metals or the two-layered film consisting of a polycrystalline silicon film and the film of the refractory metal or the film of the silicide of the refractory metal disposed on the former can be used as the second gate electrode 17. When the word line 17 consists of the polysilicon film, it can be formed simultaneously with the first gate electrode 15 because the word line 17 extends in the same direction as the first gate electrode 15.

The word line 17 is disposed on the second gate insulating film 22 and on the SiO2 film 13 inside the trench 12 as shown in FIG. 4.

On the other hand, the second gate electrode 17 constitutes an N-channel MOSFET Q2 together with an N+ type semiconductor region (source-drain region) 18 formed on the main surface Reference numeral 19 represents an inter-layer insulating film, and reference numeral 20 represents a data line that extends in a direction crossing the word line 17 at right angles. The data line 20 is connected to the N+ type semiconductor region 18 of MOSFET Q2 at a contact hole 20a. As shown in FIG. 3, the inter-layer insulating film 19 has an increased thickness in order to bury the trench 12 and thus to prevent the breakage of the data line 20, and to prevent the short-circuit of the word line 17 with the data line 20.

In D-RAM in accordance with this embodiment, two (or 2-bit) memory cells are formed in one island 11A (the portion including the main surface of the substrate 11 that is left unetched). A plurality of islands having the memory cells of the same structure are arrayed in rows and columns, thereby forming a memory cell array.

The data line 20 is connected to the N+ type semiconductor region 18 that is common to the two memory cells formed in one island. Therefore, one contact hole 20a is formed for 2 bits or one island, and moreover, at the center of each island 11A.

The capacitors C2 of the two memory cells formed in one island 11A are electrically isolated from the data line 20 (more accurately, from the N+ type region 18 connected to the data line 20) by the word line 17. As described already, the word line 17 is formed on the second gate insulating film 22 on the side walls of the trench 12 Therefore, the MOSFET exists on the side walls of the trench 12 When one of the word lines 17 extending on one island 11A is selected and MOSFET Q2 becomes conductive, the other word line 17 is in the non-selected state. Therefore, the MOSFET on the side walls is non-conductive, and it does not happen that the surface of the side wall of the trench 12 is inverted and the data of the capacitor C2 of the unselected memory cell is read out to the data line 20. When the two word lines 17 on one island 11A are not selected, the two capacitors C2 are electrically isolated from the data lines 20.

If the trench 12 is buried by an insulating material such as SiO2 before the formation of the word lines 17, the surface of the side wall of the trench 12 is likely to be inverted by the electrically floating insulating material in the trench 12. Therefore, a P type impurity must be introduced into the surface of the trench 12. This can be accomplished, for example, by forming the trench 12 at a predetermined angle, but not vertically, to the main surface of the substrate 11, and then effecting ion implantation to form the channel stopper Alternatively, the channel stopper 21 may be formed by diffusion.

A fixed potential such as a power source potential $V_{cc}$ (5 V) or $\frac{1}{2} V_{cc}$ (2.5 V) is applied to the first gate electrode 15. The gate electrode 15 is used as a common electrode by two memory cells that are connected to the same data line, are formed in different islands and are adjacent to each other. The first gate electrode 15 is also used as a common electrode by a plurality of memory cells that are formed in different islands and are connected to adjacent word lines.

In this embodiment, the capacitor C2 occupying a large proportion of the element area is formed so as to extend on the side walls and the main surface of the trench 12 formed in such a manner as to extend vertically with respect to the main surface of the substrate 11. Therefore, the occupying area of the capacitor C2 in the direction of plane can be remarkably reduced. On the other hand, the capacitors C2 of the adjacent memory elements are spaced apart from each other by the element isolation region 13 and the channel stopper 21 on the bottom of the trench 12. Therefore, leakage between the adjacent capacitors is not likely to occur, and the reliability of the memory characteristics can be improved. Because leakage is unlikely to occur, the width of the element isolation region 13, that is, the width of the trench 12, can be reduced accordingly. This makes it possible to reduce the aforementioned pitch $l_p$, of the unit memory element in cooperation with the reduction of the plane surface area of the capacitor described above, and contributes to the miniaturization of the memory device and to the higher integration density of the D-RAM.

FIGS. 5A through 5G are sectional views showing the production steps of a D-RAM that is illustrated in FIGS. 2 through 4.

Figure 5A:
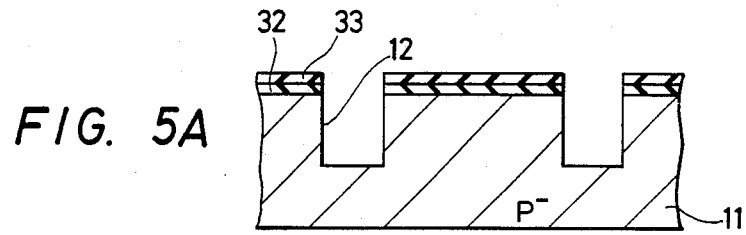
FIGS. 5A through 5G are sectional views useful for explaining the production method in accordance with one embodiment of the present invention.

As shown in FIG. 5A, a 500 Å-thick first silicon nitride ($Si_3N_4$) film 32 and a 2 μm-thick silicon oxide ($SiO_2$) film 33 is formed by CVD on the main surface of a semiconductor substrate 11 made of p$^-$ type silicon single crystal. A 200 Å-thick SiO2 film (not shown) is formed below the first Si3N4 film by the thermal oxidation of the substrate 11.

Next, the first Si3N4 film 32 and the SiO2 film 33 are patterned in predetermined shapes, and using them as a mask, the thin oxide film and the substrate 11 are etched by reactive ion etching using of $CF_4+O_2$ gas, thereby forming a 4 μm-deep trench 12. The surface of silicon exposed inside the trench 12 is thermally oxidized using the first Si$_3$N$_4$ film 32 as the mask, forming the 200 Å-thick oxide film that is not shown in the drawing.

Figure 5B:
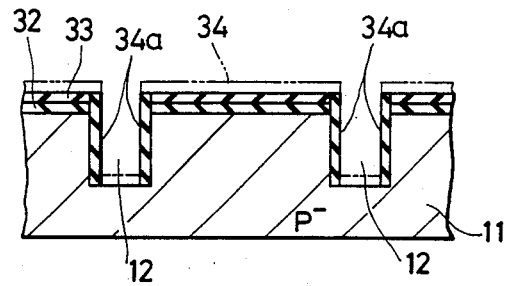
Figure 5C:
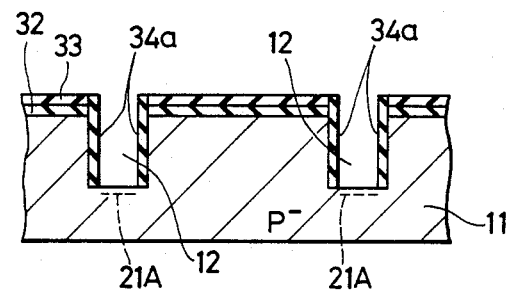

Next, as represented by two-dot-chain line in FIG. 5B, a second Si$_3$N$_4$ film 34 (500 Å thick) is formed by CVD on the entire surface, and is then anisotropically etched by reactive ion etching or the like using CF$_4$+O$_2$ gas. As a result, the second Si$_3$N$_4$ film 34a as an oxidation-resistant film remains only on the side walls of the trench 12 as shown in FIG. 5B, and the thin oxide film on the bottom of the trench 12 is exposed.

Under this state, a P type impurity such as boron is ion-implanted in a dose of $1 \times 10^{-13}$ atoms/cm$^2$. The boron ion is introduced into only the bottom of the trench 12, thereby providing an ion implantation layer 21A. This ion implantation may be effected after the thin oxide film has been formed in the trench 12.

Figure 5D:
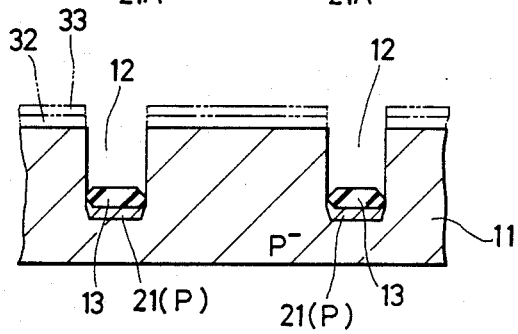
Figure 5E:
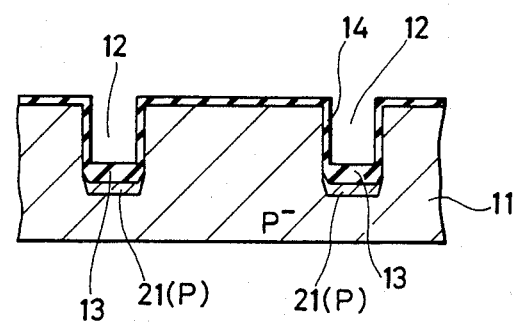

Next, the bottom of the trench 12 is selectively oxidized thermally using the first and second Si$_3$N$_4$ films 33 and 34a as the mask to form a 5,000 Å-thick SiO$_2$ film 13. Thereafter, the second Si$_3$N$_4$ film 34a, the SiO$_2$ film 33, the first Si$_3$N$_4$ film 32 and the thin oxide film, not shown, are removed by etching, thereby forming the SiO$_2$ film 13 only on the bottom of the trench 12 as shown in FIG. 5D. This heat-treatment also anneals the ion implantation layer 21A and turns it into a P type channel stopper 21. The P channel stopper 21 prevents a leakage current between memory cells.

Next, the dielectric film 14 of the capacitor is formed. First, the exposed main surface of the substrate 11 and the surface inside the trench 12 are thermally oxidized to form a thin (200 to 500 Å) silicon oxide film. After this oxide film is removed by etching, another thin (100 to 200 Å) silicon oxide film 14 is formed by thermal oxidation. This step changes the corners of the bottom of the trench 12 to a relatively smooth shape.

Figure 5F:
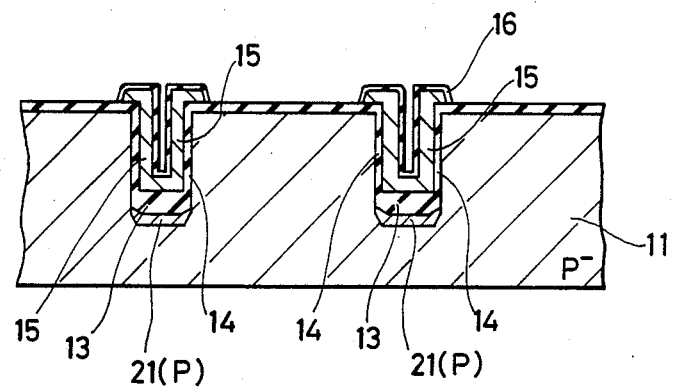
Figure 5G:
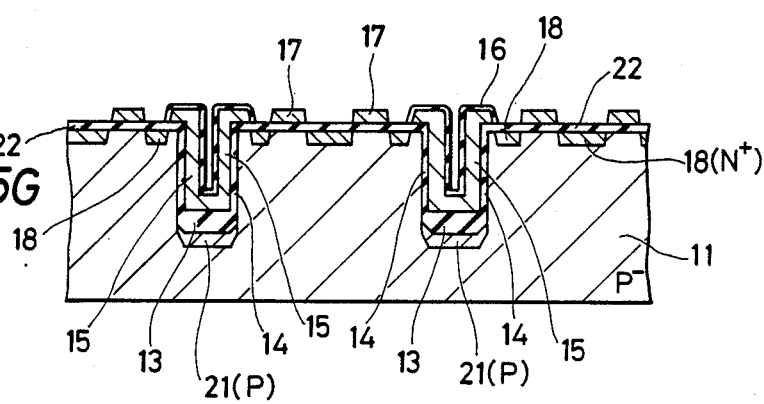

A polycrystalline silicon layer is formed by CVD, and phosphorus is then introduced to reduce its resistance. The polycrystalline silicon layer is then etched in the shape shown in FIG. 2, thereby forming a first gate electrode (capacitor electrode) 15. Since the corners of the bottom of the trench are smooth, unetched polycrystalline silicon does not remain at unnecessary portions inside the trench 12. Therefore, it is unlikely that the capacitor electrode 15 is brought into short circuit with other layers by the unetched polycrystalline silicon. A 2,000 Å-thick silicon oxide film 16 is formed by thermal oxidation on the surface of the capacitor electrode 15 as shown in FIG. 5F.

After the silicon oxide film on the surface which is not covered with layer 15 is removed, a second gate oxide film 22 is formed by thermal oxidation, and a conductive layer for forming a word line is then deposited by CVD or sputtering and is etched, providing the word line 17. The material for forming the word line 17 has been described previously. Unetched conductive layer does not remain at unnecessary portions inside the trench 12 at the time of etching for forming the word line 17. Therefore, the short-circuit between the word lines 17 can be prevented. An N type impurity (phosphorus or arsenic) is introduced using the capacitor electrode 15 and the word line 17 as the mask. An N+ type region 18 as a source or drain region of MISFET is formed.

Thereafter, the recessed portion remaining inside the trench 12 is buried, and a thick insulating film 19 is formed in order to electrically isolate the word lines 17 from other conductive layers. Contact holes 20a are then formed by a well-known technique, and data lines 20 are formed. A final protective film, not shown, is finally formed.

Another method of forming the trench 12 and the element isolation region 13 will be explained briefly.

Figure 6A:
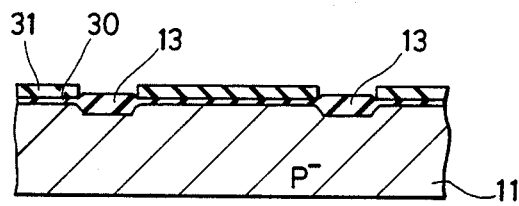
FIGS. 6A and 6B are sectional views useful for explaining the production method in accordance with another embodiment of the invention.
Figure 6B:
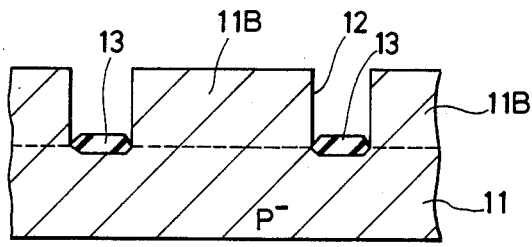

An SiO$_2$ film 30 and an Si$_3$N$_4$ film 31 are formed on the main surface of a semiconductor substrate 11, and are then etched to open the portion which corresponds to each trench 12 and to expose the surface of the substrate 11. The substrate 11 was selectively oxidized thermally using the SiO$_2$ film 30 and the Si$_3$N$_4$ film 31 as the mask, thereby providing a thick SiO$_2$ film 13 as shown in FIG. 6A. Next, the SiO$_2$ film 30 and the Si$_3$N$_4$ film 31 are removed to expose the portions of the substrate corresponding thereto, and silicon single crystal 11B is grown epitaxially on the exposed surface. Thus, the trench 12 is formed relatively as shown in FIG. 6B, and the upper surface of the epitaxial growth layer can be constituted as the main surface of the substrate.

In the production method described above, the SiO$_2$ film 13 may be a thick film formed by CVD, plasma CVD, sputtering, or the like.

The present invention provides the following effects.

(1) The element isolation region is formed on the bottom of the trench formed in the semiconductor substrate, and the capacitor is formed in such a manner as to extend on the side walls of the trench and a part of the main surface of the substrate. Therefore, the capacitor surface is formed in a direction vertical to the main surface of the substrate so that the occupying area of the capacitor on the plane can be reduced and the unit memory element can be miniaturized.

(2) Since the element isolation region is formed on the bottom of the trench, the length of the current path between adjacent capacitors formed on the side walls of the trenches can be increased, the leakage between the adjacent capacitors can be prevented and the reliability of the element can be improved.

(3) Since the leakage between the adjacent capacitors can be prevented, a problem does not occur even when the dimension of the element isolation region, that is, the width of the trench, is reduced. In combination with the effect (1), the miniaturization and high integration of the device can be accomplished by the reduction of the pitch of the memory elements.

Although the present invention has been described with reference to some preferred embodiments thereof, it is to be understood that various changes and modifications can be made by those skilled in the art without departing from the spirit and scope thereof.

For instance, a MISFET whose gate insulating film consists of an insulating film other than an oxide film, such as a silicon nitride film, may be used in place of the switch MOSFET of the memory cell. It is also possible to use a silicon nitride film or a sandwich structure film (in which the silicon nitride film is sandwiched by silicon oxide films) or other insulating films, as the dielectric film of the capacitor of each memory cell. Furthermore, the planar shape of the trench can be changed approximately in accordance with the layout pattern of the element, and the planar shapes of the capacitor, MOSFET, word lines and data lines can be changed in a corresponding manner. Furthermore, the memory cell to which the present invention is applied is not particularly limited to a one-transistor type, but may be those which include a capacitance element inside the memory cell.

What is claimed is:

1. A method of producing a semiconductor memory device equipped with memory cells, each memory cell comprising a series circuit of a capacitor and MISFET, so as to form a plurality of said memory cells each having said series circuit, said method comprising:

a step of forming trenches on a main surface of a semiconductor substrate, each of said trenches having a bottom and at least two side walls on the sides of the bottom, and a step of forming element isolation regions to isolate those elements which are to be formed on said side walls, respectively, said element isolation regions being provided at the bottoms of the trenches and including thick oxide films, the steps of forming element isolation regions and of forming trenches including selectively forming said thick oxide films at the locations of the trenches, said thick oxide films forming the element isolation regions, and forming an epitaxial semiconductor layer on the main surface of the substrate except on said thick oxide films, so as to form the trenches at the location of the thick oxide films; and a step of forming insulating films on said side walls of said trench and conductive layers on said insulating films;

wherein each of said capacitors comprise a respective one of said side walls of a trench of said semiconductor substrate, said insulating film and said conductive layer, and said capacitors formed on respective side walls of a trench are isolated from each other by said element isolation regions at the bottom of the trenches and are used as the capacitors of different memory cells.

2. A method of producing a semiconductor memory device according to claim 1 wherein said selectively forming thick oxide films is performed before forming the epitaxial semiconductor layer.

3. A method of producing a semiconductor memory device equipped with memory cells, each memory cell comprising a series circuit of a capacitor and an MISFET, so as to form a plurality of memory cells each having said series circuit, said method comprising:

a step of forming trenches on a main surface of a semiconductor substrate, each of said trenches having a bottom and at least two side walls on the sides of the bottom;

a step of forming oxidation resistant films over said side walls of said trenches;

a step of introducing impurities for forming channel stopper regions on said bottom of said trenches, said channel stopper regions having the same conductivity type as said semiconductor substrate but a higher impurity concentration;

a step of forming first oxidation films on said bottom of said trenches by using said oxidation resistant films as a mask, whereby said first oxidation films are on the channel stopper regions;

a step of removing said oxidation against resistant films over said two side walls;

a step of forming first dielectric films on said side walls of said trenches, said dielectric films having a thickness that is thinner than that of said first oxidation films; and a step of forming conductive layers on said dielectric films;

wherein each of said capacitors comprise a respective one of said side walls of said trench of said semiconductor substrate, said dielectric film and said conductive layer, and the capacitors formed on respective side walls of said trenches are isolated from each other by said first oxidation films and said channel stopper regions on said bottom of said trenches and are used as capacitors of different memory cells.

4. A method of producing a semiconductor memory device according to claim 3 wherein said at least two side walls include two side walls on opposed sides of the bottom; and wherein each of the capacitors include a respective one of the two side walls on opposed sides of the bottom, so as to form two capacitors on said two side walls, which are used as the capacitors of two different memory cells.

5. A method of producing a semiconductor memory device according to claim 3 wherein said first oxidation film comprises a silicon oxide film, said dielectric film comprises a silicon oxide film, and said oxidation resistant film comprises a silicon nitride film.

6. A method of producing a semiconductor memory device according to claim 5 wherein the steps of forming said first dielectric films and said conductive layers include forming first insulating films on said conductive layers.

7. A method of producing a semiconductor memory device equipped with memory cells, each memory cell comprising a series circuit of a capacitor and an MISFET, so as to form a plurality of memory cells each having said series circuit, said method comprising:

a step of forming trenches on a main surface of a semiconductor substrate, each of said trenches having a bottom and at least two side walls on the sides of the bottom;

a step of forming oxidation resistant films over said side walls of said trenches;

a step of forming first oxidation films on said bottom of said trenches by using said oxidation resistant films as a mask;

a step of removing said oxidation resistant films over said side walls;

a step of forming first dielectric films on said side walls of said trenches, said first dielectric films having a thickness that is thinner than that of said first oxidation films; and a step of forming conductive layers on said dielectric films;

wherein each of said capacitors comprise a respective one of said side walls of said trench of said semiconductor substrate, said dielectric film and said conductive layer, and the capacitors formed on respective side walls of a trench are isolated from each other by said first oxidation films on said bottom of said trenches and are used as the capacitors of different memory cells respectively.

8. A method of producing a semiconductor memory device according to claim 7 wherein said at least two side walls include two side walls on opposed sides of the bottom; and wherein each of the capacitors include a respective one of the two side walls on opposed sides of the bottom, so as to form two capacitors on said two side walls, which are used as the capacitors of two different memory cells.

9. A method of producing a semiconductor memory device according to claim 7 wherein said first oxidation films comprise a silicon oxide film, said first dielectric films comprise a silicon oxide film, and said oxidation resistant films comprise a silicon nitride film.

10. A method of producing a semiconductor memory device according to claim 9 wherein the steps of forming said first dielectric films and said conductive layers include forming first insulating films on said conductive layers.

11. A method of producing a semiconductor memory device equipped with memory cells, each memory cell comprising a series circuit of a capacitor and MISFET, so as to form a plurality of said memory cells each having said series circuit, said method comprising:
- a step of forming trenches on a main surface of a semiconductor substrate, each of said trenches having a bottom and at least two side walls on the sides of the bottom;
- a step of forming element isolation regions to isolate those elements which are to be formed on said side walls, respectively, said element isolation regions being provided at the bottoms of the trenches and including thick oxide films, the thick oxide films being formed by steps including a step of forming an oxidation resistant film on said two side walls of each of said trenches and a step of selectively oxidizing said semiconductor substrate at the bottom of each of said trenches to form said thick oxide films; and
- a step of forming insulating films on said side walls of said trench and conductive layers on said insulating films;
- wherein each of said capacitors comprise a respective one of said side walls of a trench of said semiconductor substrate, said insulating film and said conductive layer, and said capacitors formed on respective side walls of a trench are isolated from each other by said element isolation regions at the bottom of the trenches and are used as the capacitors of different memory cells.

12. A method of producing a semiconductor memory device according to claim 11 wherein said at least two side walls include two side walls on opposed sides of the bottom; and wherein each of the capacitors include a respective one of the two side walls on opposed sides of the bottom, so as to form two capacitors on said two side walls, which are used as the capacitors of two different memory cells.

13. A method of producing a semiconductor memory device according to claim 11 wherein the thick oxide films are formed by depositing the oxide film the thick oxide film being deposited by chemical vapor deposition, by plasma chemical vapor deposition, or by sputtering.

14. A method of producing a semiconductor memory device according to claim 11, comprising the further steps of forming a gate electrode for each said MISFET over said main surface of said substrate, in a portion of the substrate when the trenches have not been formed, and introducing an impurity of opposite conductivity type to that of the substrate, into the substrate, so as to form source and drain regions for each said MISFET.

15. A method of producing a semiconductor memory device according to claim 14 wherein said gate electrode for each said MISFET, and said conductive layers, are formed simultaneously.

16. A method of producing a semiconductor memory device according to claim 11 wherein said thick oxide films are thick silicon oxide films and are formed by depositing the silicon oxide film.

17. A method of producing a semiconductor memory device according to claim 16 wherein the silicon oxide films are deposited by chemical vapor deposition, plasma chemical vapor deposition or sputtering.

* * * * *